(12) United States Patent  
Lin et al.

(10) Patent No.: US 9,117,886 B2
(45) Date of Patent: Aug. 25, 2015

(54) METHOD FOR FABRICATING A SEMICONDUCTOR DEVICE BY FORMING AND REMOVING A DUMMY GATE STRUCTURE

(71) Applicant: UNITED MICROELECTRONICS CORP., Hsin-Chu (TW)

(72) Inventors: Ching-Ling Lin, Kaohsiung (TW); Chih-Sen Huang, Tainan (TW); Jia-Rong Wu, Kaohsiung (TW); Ching-Wen Hung, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/091,349

(22) Filed: Nov. 27, 2013

(65) Prior Publication Data

US 2015/0145027 A1    May 28, 2015

(51) Int. Cl.
  H01L 21/338    (2006.01)
  H01L 21/44     (2006.01)
  H01L 21/768    (2006.01)
  H01L 29/423    (2006.01)
  H01L 29/78     (2006.01)

(52) U.S. Cl.
  CPC ...... H01L 21/76879 (2013.01); H01L 29/4236 (2013.01); H01L 29/7827 (2013.01)

(58) Field of Classification Search
  None
  See application file for complete search history.

(56) References Cited

U.S. PATENT DOCUMENTS

| 6,803,315 | B2 | 10/2004 | Dokumaci |
| 7,977,181 | B2 | 7/2011 | Lai |
| 8,257,987 | B2 | 9/2012 | Moustakas |
| 8,450,178 | B2 | 5/2013 | Cheng |
| 2012/0028468 | A1 | 2/2012 | Cheng |
| 2012/0175711 | A1 | 7/2012 | Ramachandran |
| 2013/0062701 | A1* | 3/2013 | Lee et al. ...................... 257/369 |
| 2013/0181265 | A1 | 7/2013 | Grasshoff |
| 2013/0320412 | A1* | 12/2013 | Yamasaki ...................... 257/288 |
| 2014/0349476 | A1* | 11/2014 | Chen et al. ...................... 438/620 |
| 2014/0361352 | A1* | 12/2014 | Hung et al. ...................... 257/288 |

OTHER PUBLICATIONS

Liou, Title of Invention: Shallow Trench Isolation and Method of Forming the Same, U.S. Appl. No. 13/736,082, filed Jan. 8, 2013.
Lin, Title of Invention: Method of Fabricating Semiconductor Device, U.S. Appl. No. 14/064,722, filed Oct. 28, 2013.

* cited by examiner

Primary Examiner — Michael Jung
(74) Attorney, Agent, or Firm — Winston Hsu; Scott Margo (57) ABSTRACT

A method for fabricating a semiconductor device is provided according to one embodiment of the present invention and includes forming an interlayer dielectric on a substrate; forming a trench surrounded by the interlayer dielectric; depositing a dielectric layer and a work function layer on a surface of the trench sequentially and conformally; filling up the trench with a conductive layer; removing an upper portion of the conductive layer inside the trench; forming a protection film on a top surface of the interlayer dielectric and a top surface of the conductive layer through a directional deposition process; removing the dielectric layer exposed from the protection film; and forming a hard mask to cover the protection film.

19 Claims, 14 Drawing Sheets

METHOD FOR FABRICATING A SEMICONDUCTOR DEVICE BY FORMING AND REMOVING A DUMMY GATE STRUCTURE

BACKGROUND OF THE INVENTION

1. Field of the Invention

The present invention generally relates to the field of semiconductor devices, and more particularly to a method for fabricating a semiconductor device having a metal electrode and a self-aligned contact (SAC) structure.

2. Description of the Prior Art

Along with the continuous miniaturization of the Integrated Circuits (ICs), the feature sizes of semiconductor devices within the ICs also shrink continuously. In order to overcome electrical or processing limitations arising from the miniaturization of semiconductor devices, semiconductor manufacturers have found several solutions. For example, for a transistor device with a polysilicon gate, some disadvantages, such as boron penetration and depletion effect often occur and cause inferior performance of the transistor device. In order to solve these drawbacks, some semiconductor manufacturers adopt a gate-last process to replace the conventional polysilicon gate with a metal gate having metal electrode. Additionally, along with the shrinkage between two adjacent gate structures, semiconductor manufacturers also correspondingly invent a method for self-aligning a contact structure so as to overcome drawbacks due to the insufficient space between the two adjacent gate structures.

For a transistor device having both a metal gate and a self-aligned contact (SAC) structure, the metal gate is often covered by a mask layer before the formation of the self-aligned contact structure. In this way, the metal gate would not be etched during a process for forming the self-aligned contact structure. In the case where the gate electrode is covered by the mask layer, even though the self-aligned contact structure is close to the metal gate, there is still no unnecessary contact between them.

However, the processes for fabricating the transistor device having the metal gate and the self-aligned contact structure incur other drawbacks. Since steps for forming the mask layer often include removing an upper portion of the metal gate to leave a trench and filling up the trench with the mask layer, these steps often inevitably reduce the height of the metal gate. It is known that the electrical property of a transistor device is strongly related to the height of a metal gate. In order to maintain the height of the final metal gate within a predetermined value, the semiconductor manufacturers often increase the height of an initial dummy gate. However, this solution often results in other unwanted problems, such as the tendency of the dummy gate to collapse during a polishing process, the intense shadowing effect arising from the dummy gate during an ion implantation process, the difficulty to fill up the space between two adjacent dummy gates with a dielectric layer and to fill a metal layer into a gate trench.

Accordingly, in order to overcome the above-mentioned drawbacks, there is still a need to provide a modified method for fabricating semiconductor devices having metal gates and self-aligned contact structures.

SUMMARY OF THE INVENTION

One object of the present invention is to provide a method for fabricating a semiconductor device having a metal electrode and a SAC, which can reduce the height of an initial dummy gate and maintain the height of a final metal gate within a predetermined value.

To this end, a method for fabricating a semiconductor device is provided according to one embodiment of the present invention, includes forming an interlayer dielectric on a substrate; forming a trench surrounded by the interlayer dielectric; sequentially and conformally depositing a dielectric layer and a work function layer on a surface of the trench; filling up the trench with a conductive layer; removing an upper portion of the conductive layer inside the trench; forming a protection film on a top surface of the interlayer dielectric and a top surface of the conductive layer through a directional deposition process; removing the dielectric layer exposed from the protection film; and forming a hard mask to cover the protection film.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings:

FIG. 1 to FIG. 10 are schematic cross-sectional diagrams showing a method for fabricating a semiconductor device according to a first preferred embodiment of the present invention, wherein:

DETAILED DESCRIPTION

In the following description, numerous specific details are given to provide a thorough understanding of the invention. It will, however, be apparent to one of ordinary skill in the art that the invention may be practiced without these specific details. Furthermore, some well-known system configurations and process steps are not disclosed in detail, as these should be well-known to those skilled in the art.

Likewise, the drawings showing embodiments of the apparatus are not to scale and some dimensions are exaggerated for clarity of presentation. Also, where multiple embodiments are disclosed and described as having some features in common, like or similar features will usually be described with same reference numerals for ease of illustration and description thereof.

Figure 1:
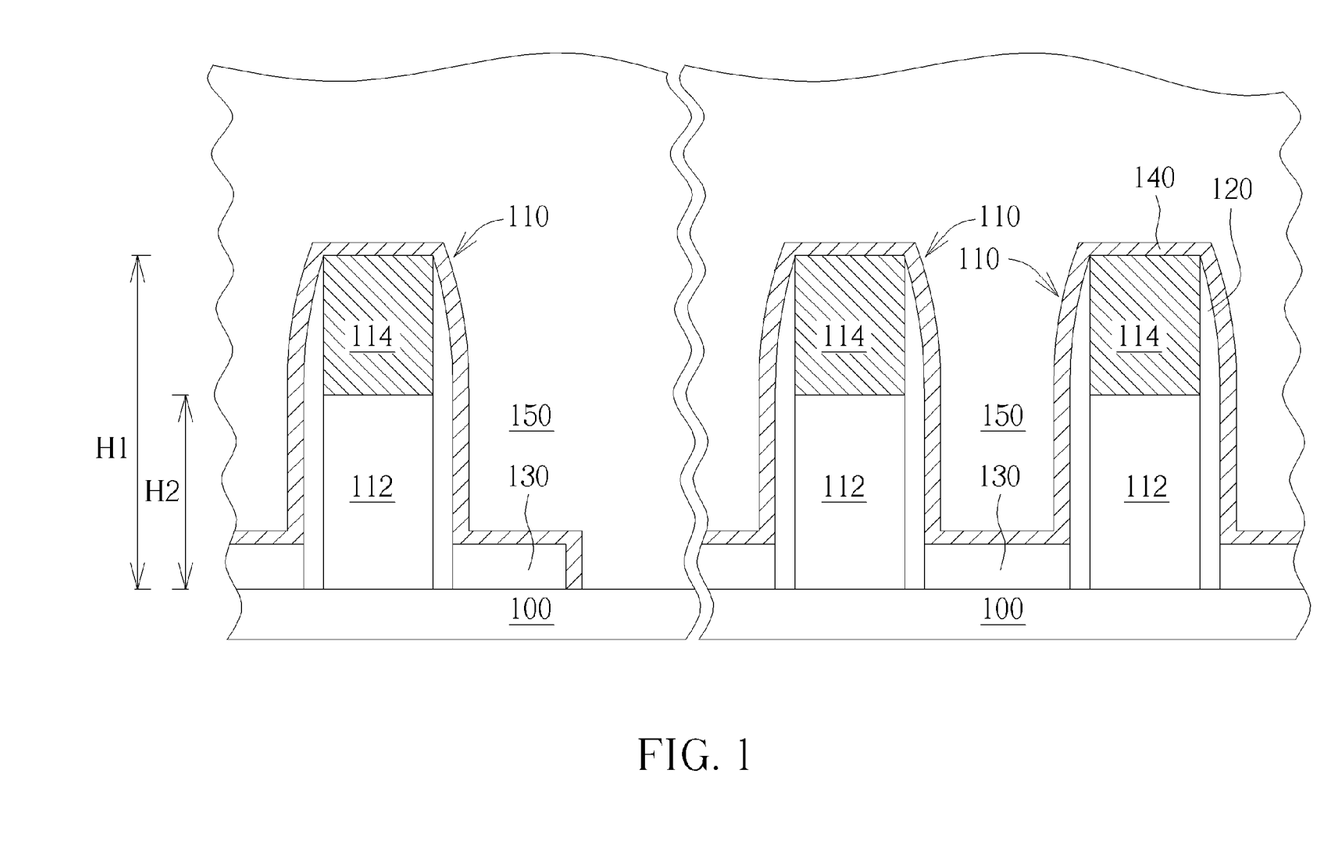
FIG. 1 is a schematic cross-sectional diagram showing a semiconductor device at the beginning of the fabrication process.

FIG. 1 to FIG. 8 are schematic cross-sectional diagrams showing a method for fabricating a semiconductor device according to a first preferred embodiment of the present invention. In the following paragraphs, processes for fabricating a semiconductor device having transistor structures and at least a contact structure are described in detail. Please refer to FIG. 1. FIG. 1 is a schematic cross-sectional diagram showing a semiconductor device at the beginning of the fabrication process. As shown in FIG. 1, a substrate having stack structures, spacers, epitaxial layers, doped regions, cap layers and interlayer dielectric disposed thereon or therein is provided. For example, the substrate 100 may be a semiconductor substrate with several protruding fin structures on its surface, but not limited thereto. The stack structures maybe dummy gate structures 110 respectively including an interfacial layer (not shown), a sacrificial layer 112 and a cap layer 114 stacked from bottom to top. The spacers may be gate spacers 120 which are respectively disposed on the sides of each of the dummy gate structures 110. The epitaxial layers 130 are disposed inside or outside the substrate 100 and are respectively disposed on each side of the dummy gate structure 110, but not limited thereto. The doped regions (not shown) may be, for example, lightly-doped drains (LDD) and/or source/drain regions, which are respectively disposed on each side of each dummy gate structure 110. Besides, the doped regions may be optionally located in the substrate 100 or the epitaxial layers 130, but not limited thereto. Preferably, the dummy gate structures 110 may be sequentially covered by a conformal etch stop layer 140 and a first interlayer dielectric 150.

The above-mentioned substrate 100 may be selected from a silicon substrate, a silicon-germanium substrate or a silicon-on-insulator (SOI) substrate, but not limited thereto. In a case where the surface of the substrate 100 has protruding fin structures, the bottom of each dummy gate structure 110 may surround a section of the corresponding protruding fin structure. The interfacial layer (not shown), the sacrificial layer 112 and the cap layer 114 in each dummy gate structure 110 may respectively correspond to an oxide layer, a silicon layer and a nitride layer, for example a silicon oxide layer, a polysilicon layer and a silicon nitride layer, but not limited thereto. The gate spacers 120 may have single-layered or multi-layered structures and may be made of silicon nitride, silicon carbide, silicon carbon nitride, silicon oxynitride or other suitable semiconductor compounds. The epitaxial layers 130 disposed at two sides of the dummy gate structures 110 may be selected from doped or un-doped semiconductor materials, such as silicon germanium, silicon phosphor, silicon carbon or the like. The epitaxial layers 130 may impose required stress on channel regions of the semiconductor device and accordingly improve the carrier mobility in the channel regions. The etch stop layer 140 may be selected from a silicon carbon nitride, a silicon oxynitride, a silicon nitride, a silicon carbide or other suitable semiconductor compounds. The etch stop layer 140 may also impose required stresses on the channel regions and/or act as an etch stop layer during a subsequent process for forming a contact structure. The first interlayer dielectric 150 may be selected from non-conductive dielectric materials, such as silicon oxide or the like.

At this stage, there is a first height H1 between the top surface of each cap layer 114 and that of the substrate 100, while there is a second height H2 between the top surface of the sacrificial layer 112 and that of substrate 100. The first height H1 approximately ranges from 1000 Angstroms to 2000 Angstroms and preferably is 1300 Angstroms. The second height H2 approximately ranges from 700 Angstroms to 1200 Angstroms and preferably is 900 Angstroms.

Then, a polishing process and/or an etching process is carried out, such as a chemical mechanical polishing (CMP) process, to completely remove the cap layer 114 until the top surfaces of the sacrificial layers 112 are exposed. In this process, since upper portions of the sacrificial layer 112 in each dummy gate structure 110 may be removed, a height between the top surface of each sacrificial layer 112 and that of the substrate 100 may be slightly reduced.

Figure 2:
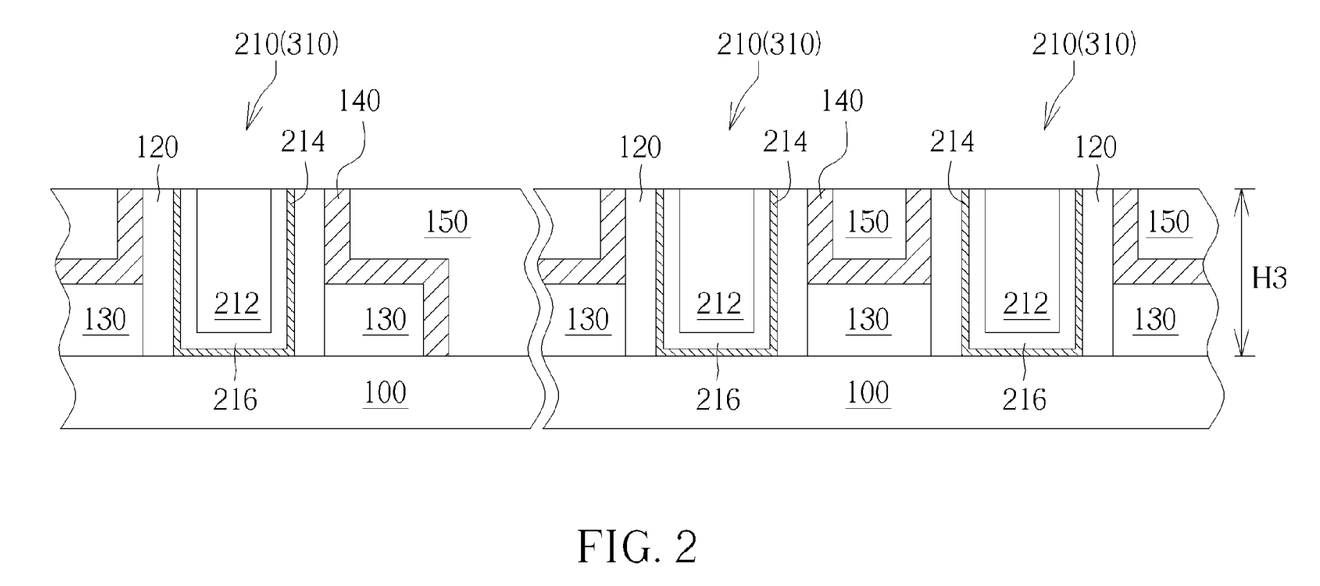
FIG. 2 is a schematic diagram showing a semiconductor device after carrying out a replacement metal gate process.

FIG. 2 is a schematic diagram showing a semiconductor device after carrying out a replacement metal gate process. After the planarization process, a replacement metal gate (RMG) process may be carried out so as to form a structure shown in FIG. 2. Referring to FIG. 1 and FIG. 2, the RMG process may at least include the following steps. First, the sacrificial layer 112 within each dummy gate structure 110 is removed in order to leave a trench 210. Then, a dielectric layer 214, a work function layer 216 and a conductive layer 212 are sequentially filled into the trench 210. Afterwards, a polishing process is carried out to remove the conductive layer 212, the work function layer 216, and the dielectric layer 214 outside the trench 210 until the first interlayer dielectric layer 150 is exposed. At this time, several metal gate structures 310 are obtained and a conductive layer 212 in each trench 210 may act as a gate electrode of the metal gate structures 310. Optionally, there may be other layers disposed between the dielectric layer 214 and the conductive layer 212. For example, a bottom barrier layer (not shown) and a top barrier layer (not shown) may be respectively disposed under and on the work function layer 216, but not limited thereto.

At this stage, the top surfaces of the conductive layers 212 are preferably substantially leveled with that of the first interlayer dielectric 150. Besides, there is a third height H3 defined between the top surfaces of the conductive layers 212 and that of the substrate 100 at this time. Since the above-mentioned polishing process may not only remove the conductive layers, but also remove portions of the gate spacers 120, the etch stop layer 140 and the first interlayer dielectric 150, the third height H3 may be therefore slightly lower than the second height H2.

Specifically, the dielectric layer 214 is preferably a high-k dielectric layer with a dielectric constant substantially greater than 20. As an example, the dielectric layer 214 could be selected from the group consisting of hafnium oxide ($HfO_2$), hafnium silicon oxide (HfSiO), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), strontium bismuth tantalite ($SrBi_2Ta_2O_9$, SBT), lead zirconate titanate ($PbZr_xTi_{1-x}O_3$, PZT), and barium strontium titanate ($Ba_xSr_{1-x}TiO_3$, BST), but not limited thereto. Additionally, the work function layers 216 include titanium nitride (TiN), titanium carbide, (TiC), tantalum nitride (TaN), tantalum carbide (TaC), tungsten carbide (WC) or aluminum titanium nitride (TiAlN), but not limited thereto. The conductive layers 212 used as gate electrodes may be made of metal or metal oxide with superior filling ability and relative low resistance, such as aluminum (Al), titanium aluminum (TiAl), titanium aluminum oxide (TiAlO), tungsten (W) or copper (Cu), but not limited thereto.

Additionally, since the above-mentioned process is a gate-last process accompanied with a high-k last process, both the dielectric layer 214 and the work function layer 216 are preferably disposed on the sidewalls and the bottom of each trench 210. However, the present embodiment is not limited thereto. In other words, a gate-last process accompanied with a high-k first process may be applied instead. In this way, prior to the removal of the sacrificial layer, the substrate within the trenches may be covered by the high-k dielectric layers. Optionally, a barrier layer (not shown) may be formed to cover the high-k dielectric layer so that the high-k dielectric layer is not removed along with the sacrificial layer. The barrier layer may be a metal layer, such as a titanium nitride layer, but not limited thereto.

Figure 3:
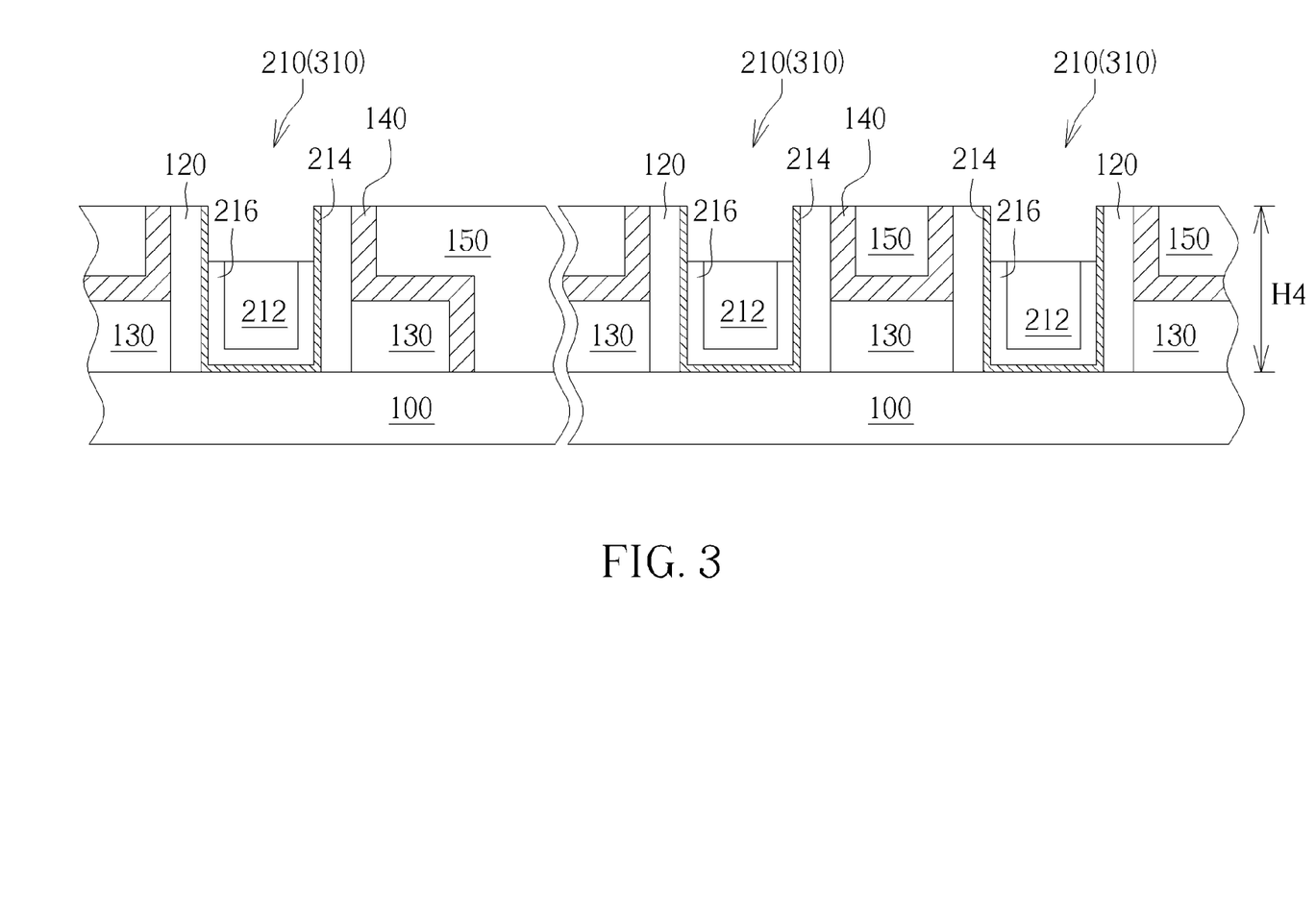
FIG. 3 is a schematic diagram showing a semiconductor device after removing upper portions of conductive layers and work function layers.
Figure 4:
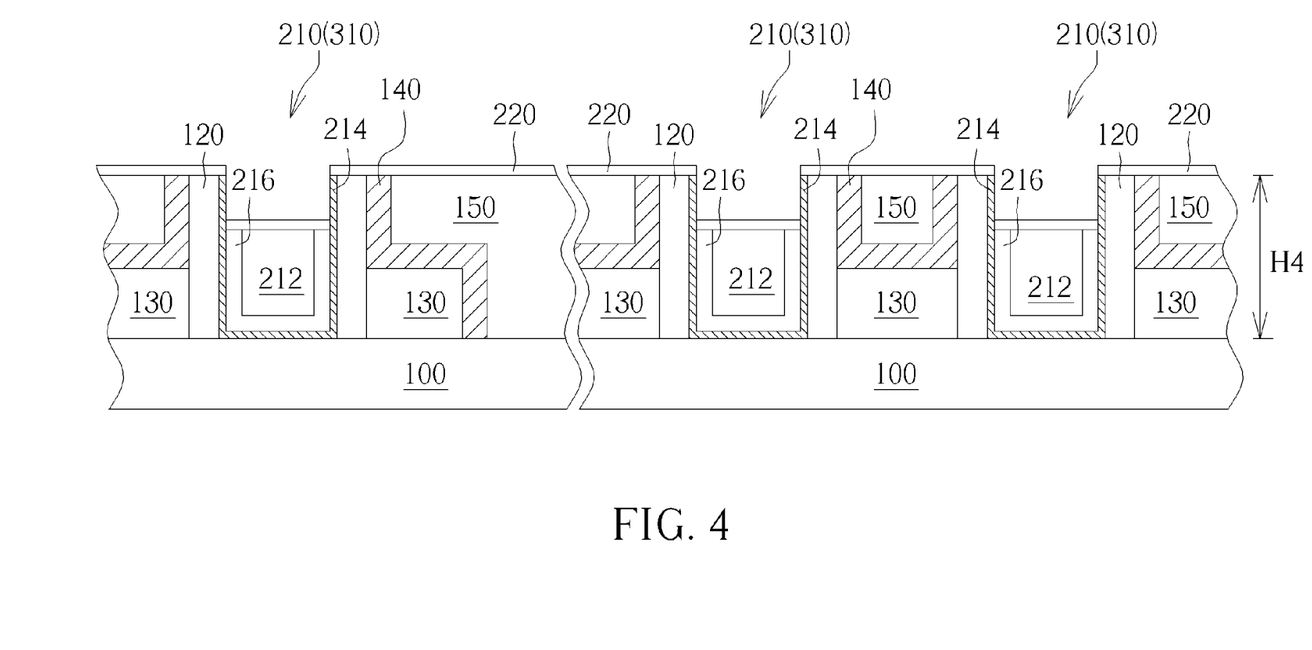
FIG. 4 is a schematic diagram showing a semiconductor device after depositing a protection film.

Please refer to FIG. 3. FIG. 3 is a schematic diagram showing a semiconductor device after removing upper portions of conductive layers and work function layers. Referring to FIG. 3, at least an etching process is carried out to remove upper portions of the conductive layers 212 and upper portions of the work function layers 216. Preferably, the dielectric layers 214 are not removed during this etching process so that portions of the dielectric layers 214 on the inner sides of the spacers 120 may be exposed from the conductive layers 212 and the work function layers 216 during the etching process. Also, since portions of the first interlayer dielectric 150 may also be slightly etched during the etching process, the height of the first interlayer dielectric 150 may be further reduced to be a fourth height H4. In addition, although the top surface of the conductive layers 212 and the top surface of the work function layers 216 are level as depicted in FIG. 4, there may be a difference between them according to other embodiments of the present invention. For example, in a case where the etching selectivity between the conductive layers 212 and the work function layers 216 is lower than 1, the work function layers 216 may be removed more during the etching process.

Please refer to FIG. 4. FIG. 4 is a schematic diagram showing a semiconductor device after depositing a protection film. At this stage, a protection film 220 with poor step coverage is deposited to only cover the top surface of the first interlayer dielectric 150, the top surfaces of the conductive layers 212 and the top surfaces of the work function layers 216. In this way, portions of dielectric layers 214 on the inner sides of the spacers 120 may remain uncovered or be slightly covered even though the protection film 220 is formed on the top surface of the first interlayer dielectric 150 and the top surfaces of the conductive layers 212. According to this embodiment, the composition of the protection film 220 may be different from that of the first interlayer dielectric 150 and dielectric layers 214. For example, it may be conductive materials or non-conductive materials. Preferably, the protection film 220 is made of silicon nitride, but not limited thereto.

Figure 5:
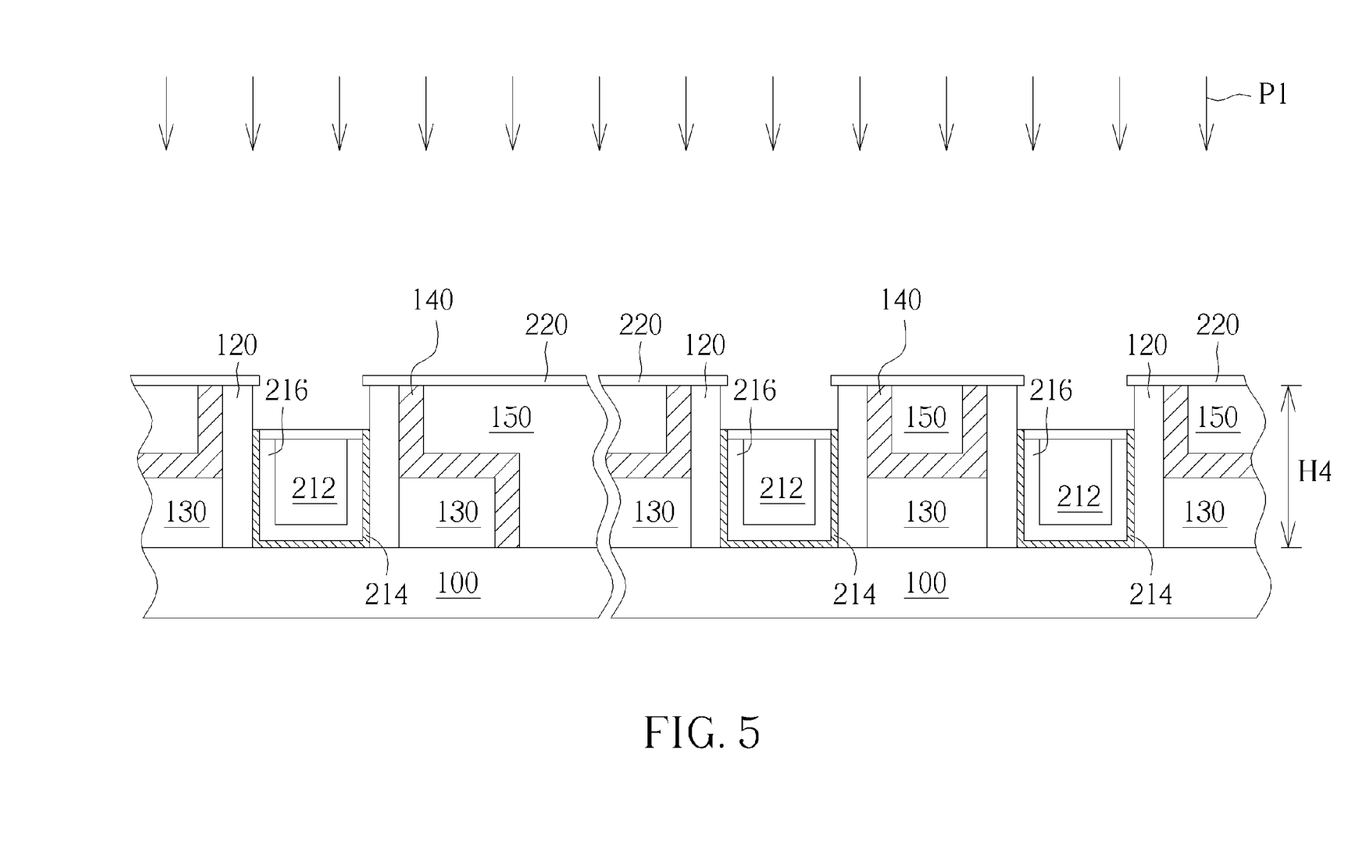
FIG. 5 and FIG. 6 are schematic diagrams respectively showing a semiconductor device after removing an exposed protection film.
Figure 6:
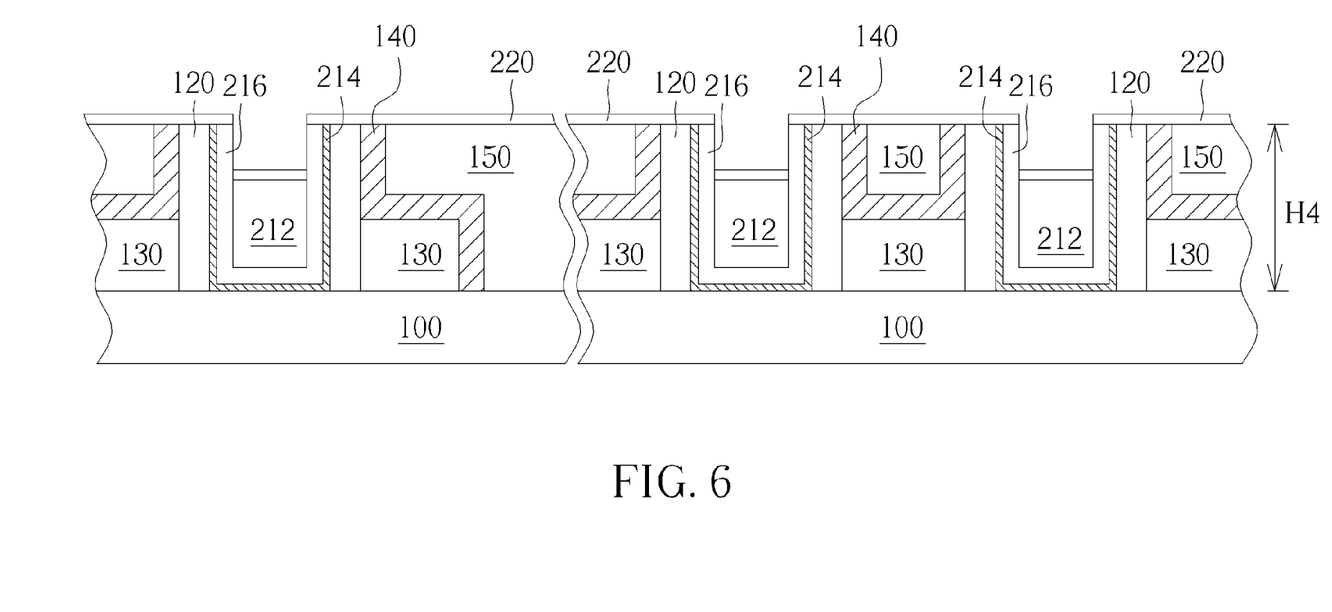

Please refer to FIG. 5 and FIG. 6. FIG. 5 and FIG. 6 are schematic diagrams respectively showing a semiconductor device after removing an exposed protection film. Referring to FIG. 5, an etching process, such as an isotropic etching process P1 is carried out to remove the exposed dielectric layers 214 until the corresponding spacers 120 are exposed. At this time, because the first interlayer dielectric 150 are at least covered by the protection film 220 and the spacers 120, the height of the first interlayer dielectric 150 is not further reduced during the etching process. In this way, space may be generated above the conductive layers 212 and may be enough to accommodate the subsequently formed hard mask (not shown). As a result, the heights of the initial dummy gates are therefore reduced. Specifically, in a case where the composition of the dielectric layers 214 is oxide, the formula of the isotropic etching process P1 may be dilute hydrofluoric acid (DHF), but not limited thereto. Alternatively, referring to FIG. 6, the protection film 220 is not limited to be formed after the removal of the work function layers 216, it may also be deposited before the removal of the work function layers 216. In this way, the work function layers 216 may remain uncovered or be slightly covered after the formation of the protection film 220. In the following processes, similarly, portions of the work function layers and portions of the dielectric layers may be removed successively through suitable etching processes so as to expose corresponding spacers. These similar processes are omitted for the sake of clarity.

In addition, for a case where an etching back process is performed to etch the conductive layer before planarizing the conductive layer, the work function layer, and the dielectric layer outside the trench, the protection film with poor step coverage may be deposited between the etching back process and the planarization process. In this way, the protection film may cover the work function layer outside the trench while exposing the work function layers in the trench. In the following processes, similarly, portions of the work function layers and portions of the dielectric layers may be removed successively through suitable etching processes so as to expose corresponding spacers. These similar processes are omitted for the sake of clarity.

Figure 7:
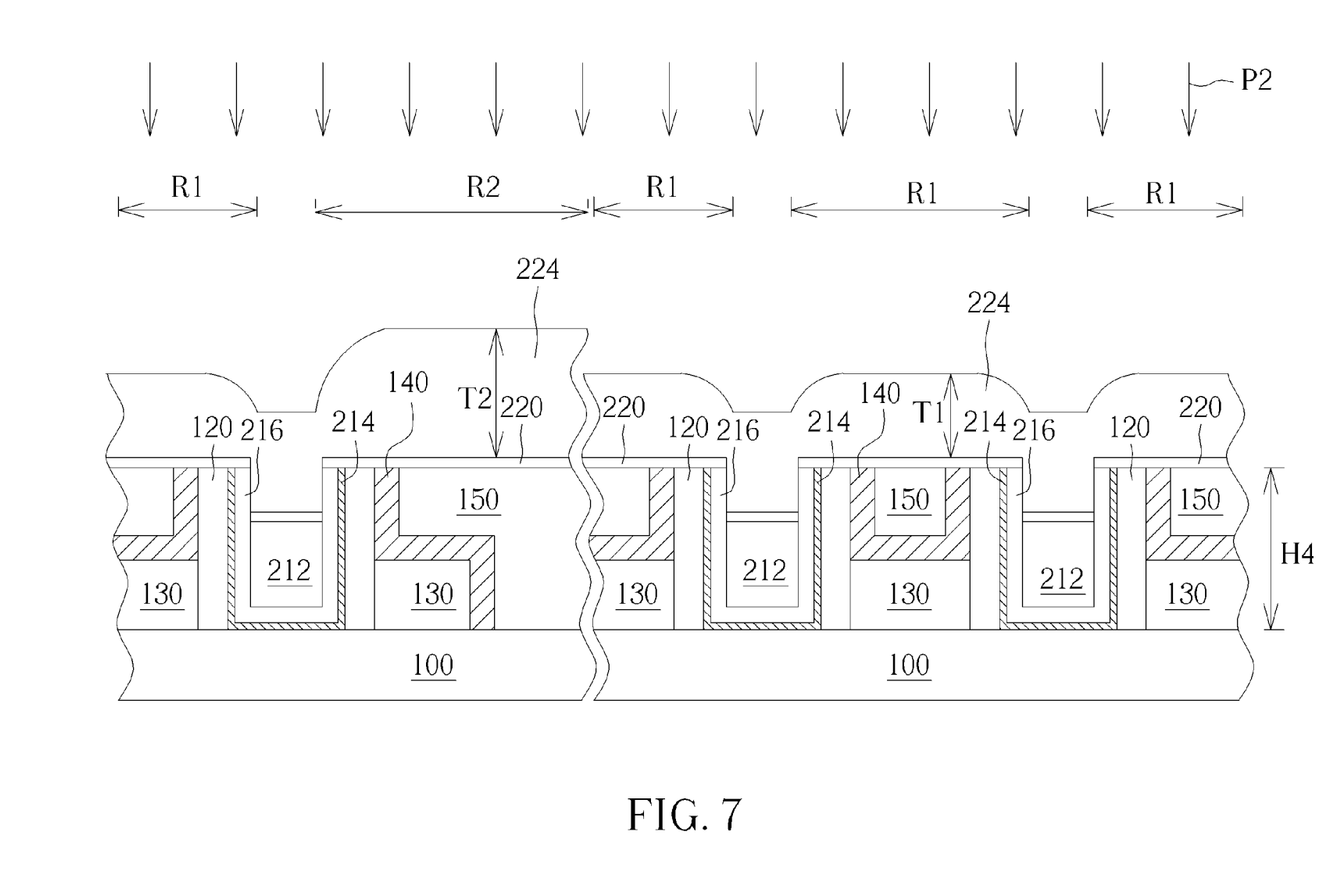
FIG. 7 is a schematic diagram showing a semiconductor device after depositing a layer of hard mask.

Please refer to FIG. 7. FIG. 7 is a schematic diagram showing a semiconductor device after depositing a layer of hard mask. Referring to FIG. 7, a layer of hard mask 224 is deposited on the first interlayer dielectric 150 and the conductive layers 212 through a depositing process P2, such as a chemical vapor deposition (CVD) process or the like. It should be noted that, since the top surface of the first interlayer dielectric 150 is not level with that of the conductive layers 212, the layer of hard mask 224 may have rugged surface in this case. Specifically, since the area of the first interlayer dielectric 150 may influence the thickness of the layer of hard mask 224, the layer of hard mask 224 deposited on regions with small area may be thinner than the layer of hard mask 224 deposited on regions with large area. In this case, the thickness T1 of the layer of hard mask 224 within first regions R1 is thinner than the thickness T2 of the layer of hard mask 224 within second regions R2.

Figure 8:
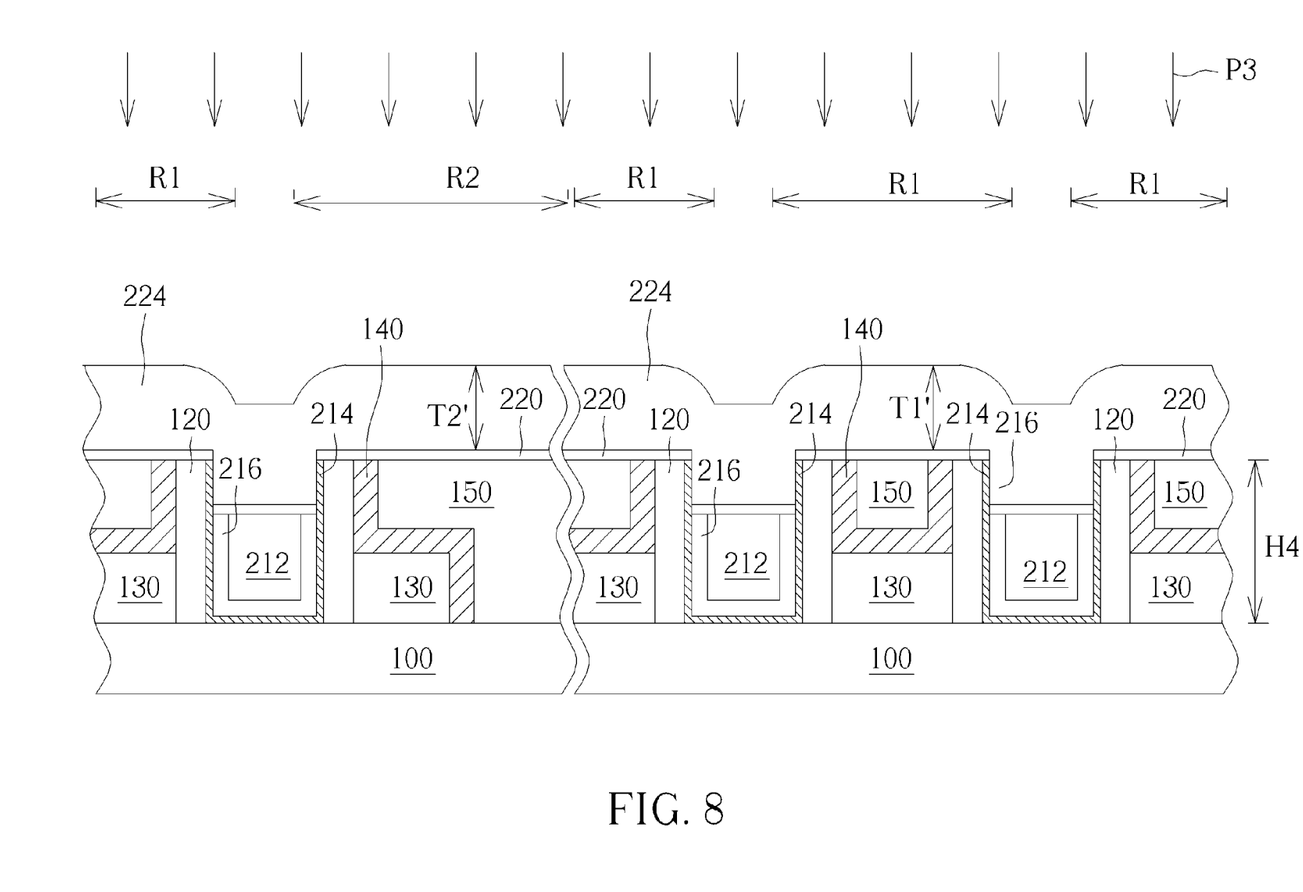
FIG. 8 and FIG. 9 are schematic diagrams showing a method for fabricating a semiconductor device after performing an etching process.
Figure 9:
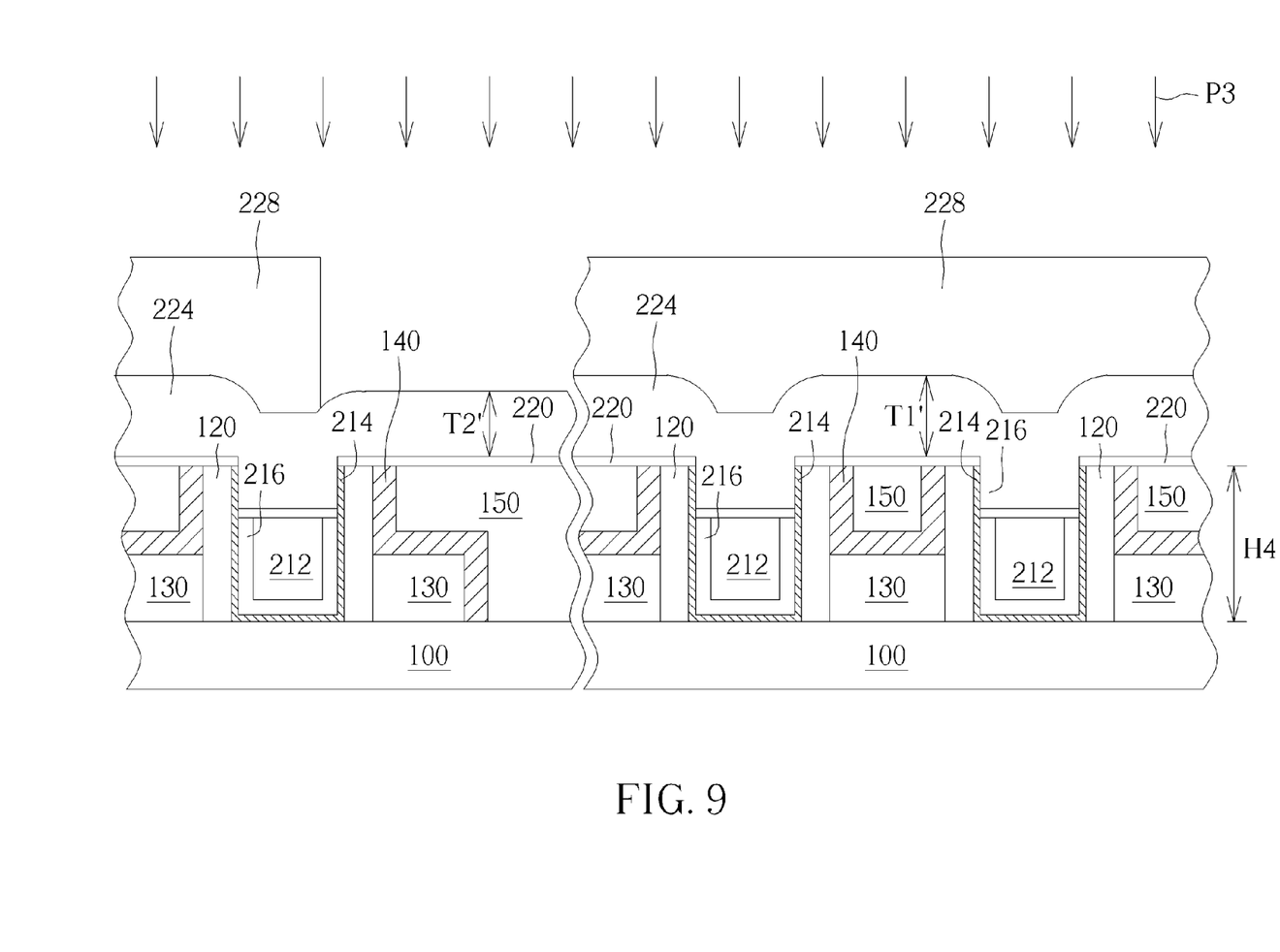

After the deposition of the layer of hard mask 224, a planarization process is carried out to remove the layer of hard mask 224 outside the gate trenches. Optionally, since the rugged surface is hard to be planarized by only performing the planarization process, a suitable etching process may be carried out before the planarization process. Please refer to FIG. 8. FIG. 8 is a schematic diagram showing a method for fabricating a semiconductor device after performing an etching process. Because the layer of hard mask 224 deposited on regions within the first regions R1 is thinner than the layer of hard mask 224 deposited on regions within the second regions R2, the layer of hard mask 224 within the second regions R2 is relatively hard to be removed. In order to solve this drawback, the layer of hard mask 224 may be blank etched by a suitable etching process P3. During the etching process P3, the layer of hard mask 224 within the second regions R2 would be removed faster than that within the first regions R1. As a result, the thickness T1' of the layer of the hard mask 224 within the first regions R1 may be substantially equal to the thickness T2' of the layer of the hard mask 224 within the second regions R2. Alternatively, referring to FIG. 9, a patterned cover layer 228 may be further formed to cover the layer of hard mask 224 within the first regions R1 before performing the etching process P3. In this way, the thickness T2' of the layer of the hard mask 224 within the second regions R2 may become thinner than the thickness T1' of the layer of the hard mask 224 within the first regions R1. Specifically, the composition of the cover layer 228 may be photoresist, dielectric layer or the like, but not limited thereto. Besides, there may be another alternative way to eliminate the rugged surface. For example, a cover layer with a flat surface may be form to completely cover the layer of hard mask within the first region and the second regions. Then, a blank etching process is carried out to concurrently remove the cover layer and the underlying the layer of hard mask. As a result, the thickness of the layer of the hard mask within the first and second regions may be down to the same value. Preferably, in this case, the etch rate of the cover layer may be similar to that of the layer of hard mask under specific etchants by choosing suitable materials as the cover layer. Specifically, the cover layer may be oxide or nitride, but not limited thereto.

Figure 10:
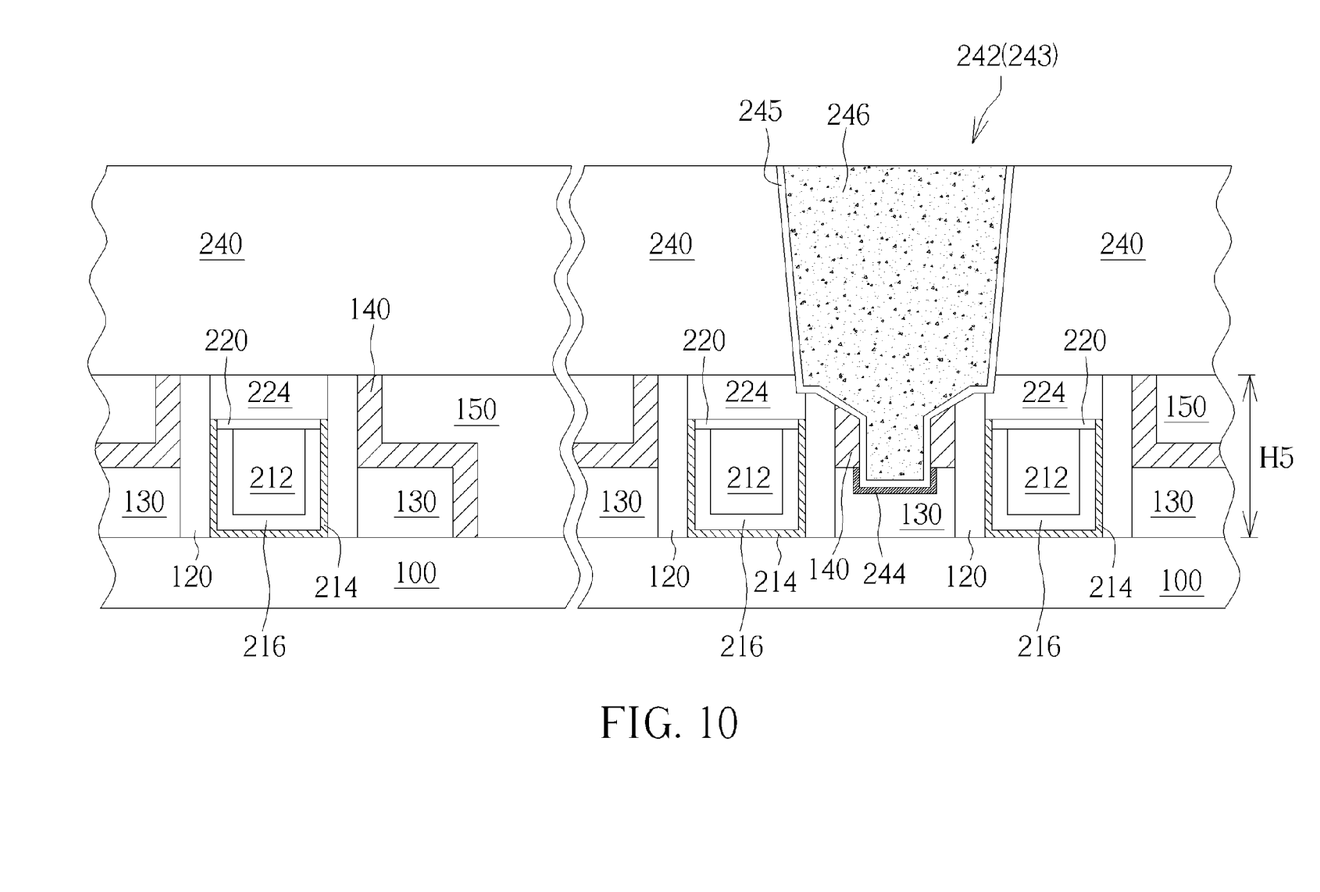
FIG. 10 is a schematic diagram showing a semiconductor device after forming self-aligned contacts.

Then, processes for forming contact holes and self-aligned contacts may be carried out. These processes will be described in detail in the following paragraphs. Please refer to FIG. 10. FIG. 10 is a schematic diagram showing a semiconductor device after forming self-aligned contacts. Referring to FIG. 8, the hard masks 224 may respectively cover the protection layers 220 and are level with the first interlayer dielectric 150 after the above planarization process. According to this embodiment, the height of the first interlayer dielectric 150 may be further reduced to be a fifth height H5 during the planarization process. Besides, the width of the hard mask 224 in the trench 210 is wider than the width of the protection film 220 in the trench 210. Afterwards, a second interlayer dielectric 240, such as a pre-metal dielectric (PMD), may be blank deposited to completely cover the hard masks 224, the spacers 120 and the first interlayer dielectric 150. The composition of the second interlayer dielectric 240 may be similar to that of the first interlayer dielectric 150, such as a silicon oxide, so that there is the same or similar etching rate between them. Then, a photolithographic process and an etching process are carried out to form a contact hole 242 in the second interlayer dielectric 240 and the first interlayer dielectric 150. The contact hole 242 may expose the epitaxial layers 130 or the substrate 100 disposed between each of the conductive layers 212.

It should be noted that, there is a certain etching selectivity among the second interlayer dielectric 240, the first interlayer dielectric 150, the hard masks 224, the spacers 120, and the etch stop layer 140. Specifically, with the selected etchants and etching recipes, the etching rate of the hard masks 224, the spacers 120 and the etch stop layer 140 is lower than the etching rate of the second interlayer dielectric 240 and the first interlayer dielectric 150. In this way, only a little amount of the hard masks 224, the spacers 120 and the etch stop layer 140 may be removed during the etching process. Accordingly, even though a misalignment occurs during the photolithographic process, only the epitaxial layer 130 or the substrate 100 may be exposed from the contact hole 242 rather than the gate electrodes 212. The etchants described above may be chosen from suitable gas etchants, such as $C_4F_6$, $C_5F_8$, $O_2$, Ar, CO, $CH_2F_2$ or the mixture thereof, but not limited thereto.

Still referring to FIG. 10, a self-aligned silicidation process is then carried out to form a metal silicide 244 in the epitaxial layer 130. Afterwards, a self-aligned contact process is performed to sequentially fill a barrier layer 245 and a metal layer 246 into the contact hole 242 so as to form a self-aligned contact structure 243. It should be noted that the self-aligned contact structure 243 may directly contact the hard masks 224, the spacers 120, the etch stop layer 140, the second interlayer dielectric 240 and the first interlayer dielectric 150, and electrically connect the underneath metal silicide 244, but not limited thereto.

The above-mentioned metal silicide 244 may be a silicide and metal element of the silicide may be selected from the group consisting of tungsten (W), aluminum (Al), copper (Cu), titanium (Ti), tantalum (Ta), niobium (Nb), erbium (Er), molybdenum (Mo), cobalt (Co), nickel (Ni), platinum (Pt) or alloys of which. The self-aligned contact structure 243 may be selected from the group consisting of tungsten (W), aluminum (Al), titanium (Ti), copper (Cu), molybdenum (Mo), cobalt (Co), platinum (Pt) or alloys of which. The barrier layer 245 may be made of titanium nitride (TiN), tantalum nitride (TaN), Ti/TiN or Ta/TaN, but not limited thereto.

In the following paragraphs, one modification according to the first embodiment of the present invention is disclosed. For the sake of clarity, only the main difference between the modification and the first preferred embodiment is described, the same or similar processes or structures may refer back to previously described first preferred embodiment.

Figure 11:
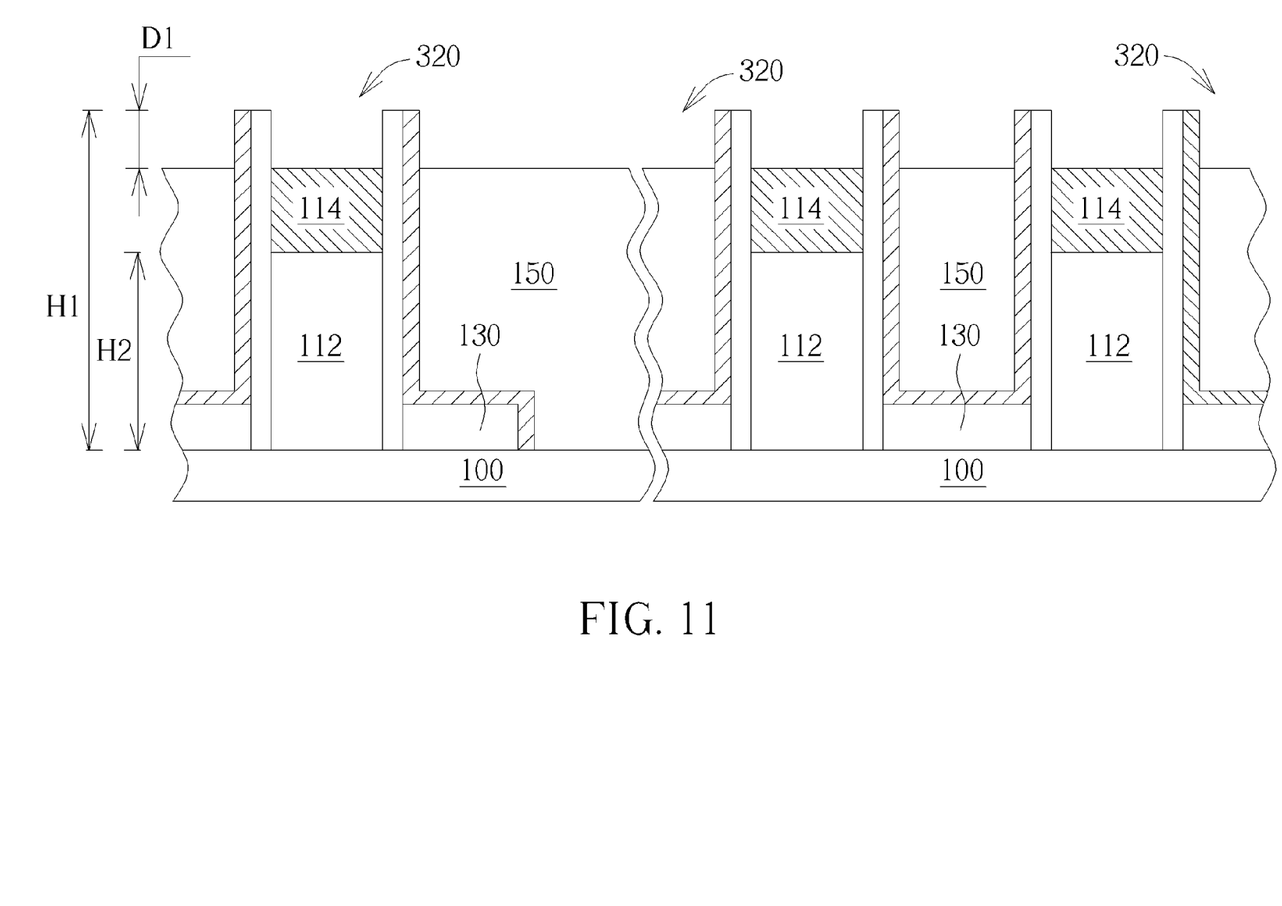
FIG. 11 to FIG. 14 are schematic diagrams respectively showing a method for fabricating a semiconductor device having a metal electrode and a self-aligned contact structure according to a first modification of the present invention.
Figure 12:
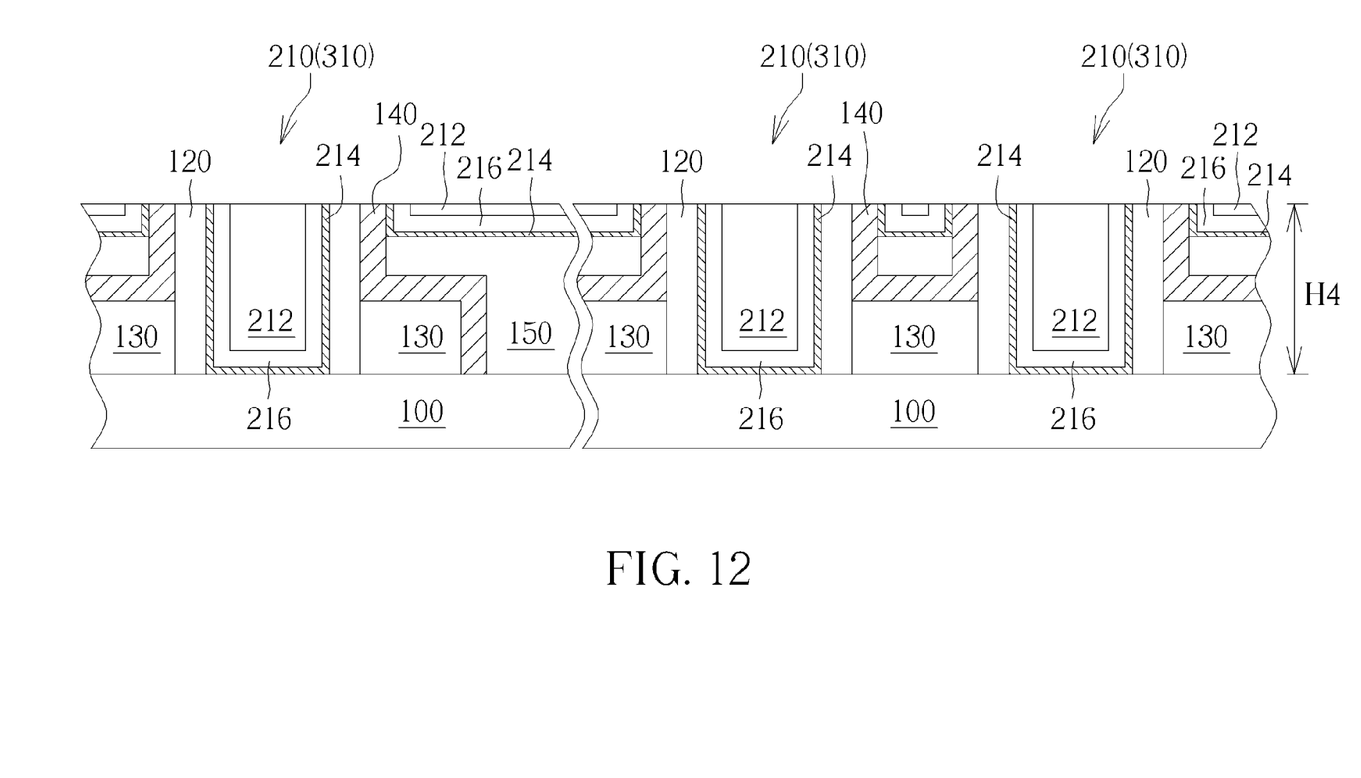

Please refer to FIG. 11 to FIG. 14. FIG. 11 to FIG. 14 are schematic diagrams showing a method for fabricating a semiconductor device having a metal electrode and a self-aligned contact structure according to a first modification of the present invention. Referring to FIG. 11, similar to a step performed between FIG. 1 and FIG. 2, the dummy gate structures 110 having the sacrificial layer 112 and the cap layer 114 may be exposed during the corresponding planarization process. However, one main difference between the first modification and the first embodiment is that portions of the first interlayer dielectric 150 are further removed during the process for removing the cap layers 114 according to this modification. As a result, several recesses 320 with first depths D1 may be formed on the first interlayer dielectric 150. In this way, both the spacers 120 and the etch stop layers 140 originally disposed between the dummy gate structures 110 and the first interlayer dielectric 150 may protrude form the first interlayer dielectric 150.

Afterwards, the cap layer and the sacrificial layer are removed completely so as to leave trenches surrounded by the spacers. Then, referring to FIG. 12, the dielectric layer 214, the work function layer 216 and the conductive layer 212 are formed in the trench through the processes similar to those performed in FIG. 2. According to this modification, the recesses 320 may also be filled with the dielectric layer 214, the work function layer 216 and the conductive layer 212. Optionally, there may be other layers disposed between the dielectric layer 214 and the conductive layer 212. For example, a bottom barrier layer (not shown) and a top barrier layer (not shown) may be respectively disposed under and on the work function layer 216, but not limited thereto.

Figure 13:
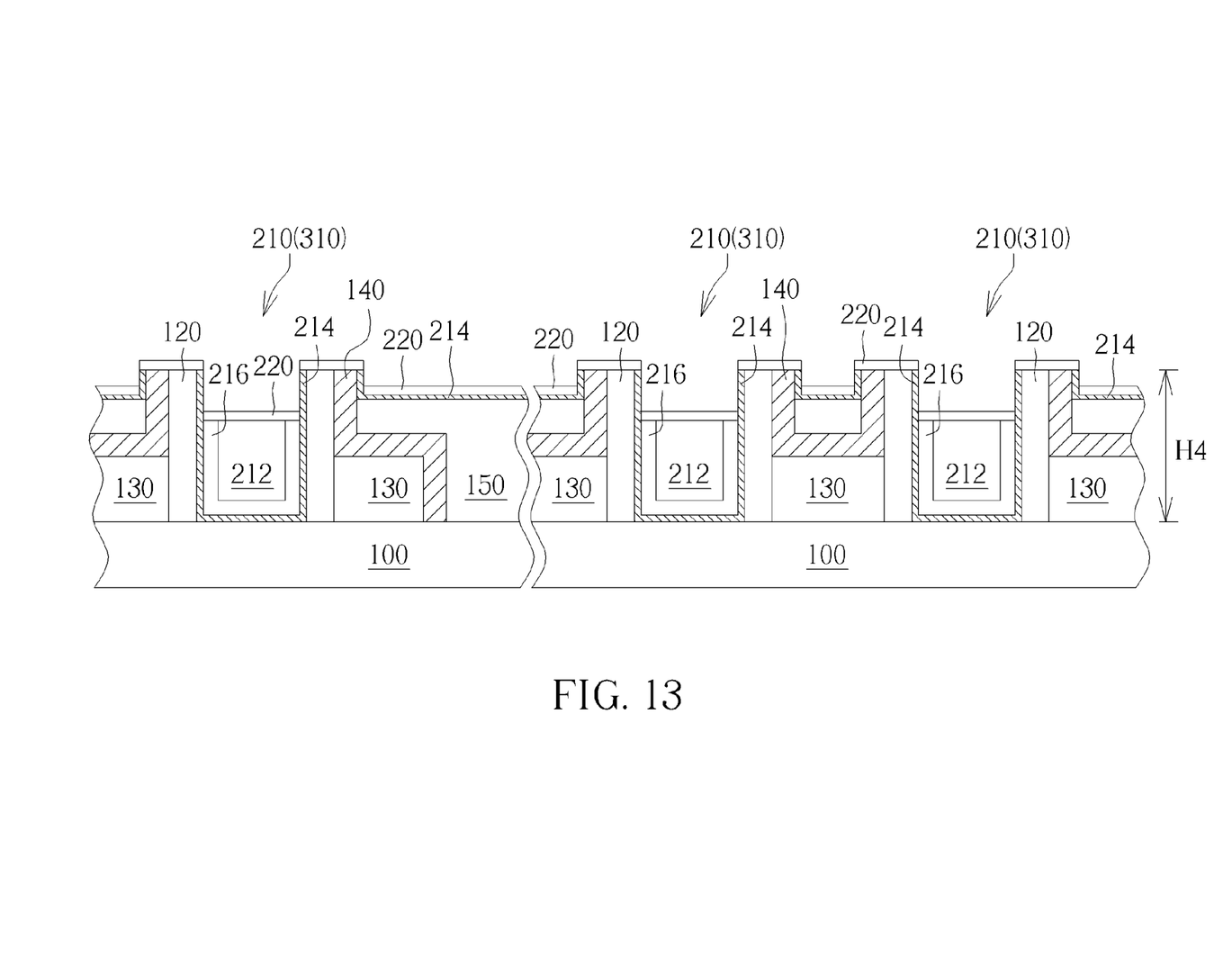

Please refer to FIG. 13, similar to the processes performed in FIG. 3 and FIG. 4, at least an etching process is carried out to remove portions of the conductive layers 212 and portions of the work function layers 216. Precisely, the conductive layer 212 and the work function layer 216 in each recess 320 may be removed completely. During this etching process, the height of the first interlayer dielectric 150 would not be reduced since the top surface of the first interlayer dielectric 150 is at least protected by the dielectric layer 214. Afterwards, a protection film 220 is also deposited to cover the top surface of the spacers 120, the top surface of the etch stop layer 140, the top surfaces of the conductive layers 212 in the trench and the top surface of the dielectric layer 214 in the recesses. Specifically, the protection film 220 may be formed by performing the directional deposition process, such as plasma-enhanced chemical vapor deposition (PECVD). In this way, portions of dielectric layers 214 on the inner sides of the spacers 120 and on the inner sides of the recesses 320 may remain uncovered even though the protection film 220 is formed through the deposition process.

Figure 14:
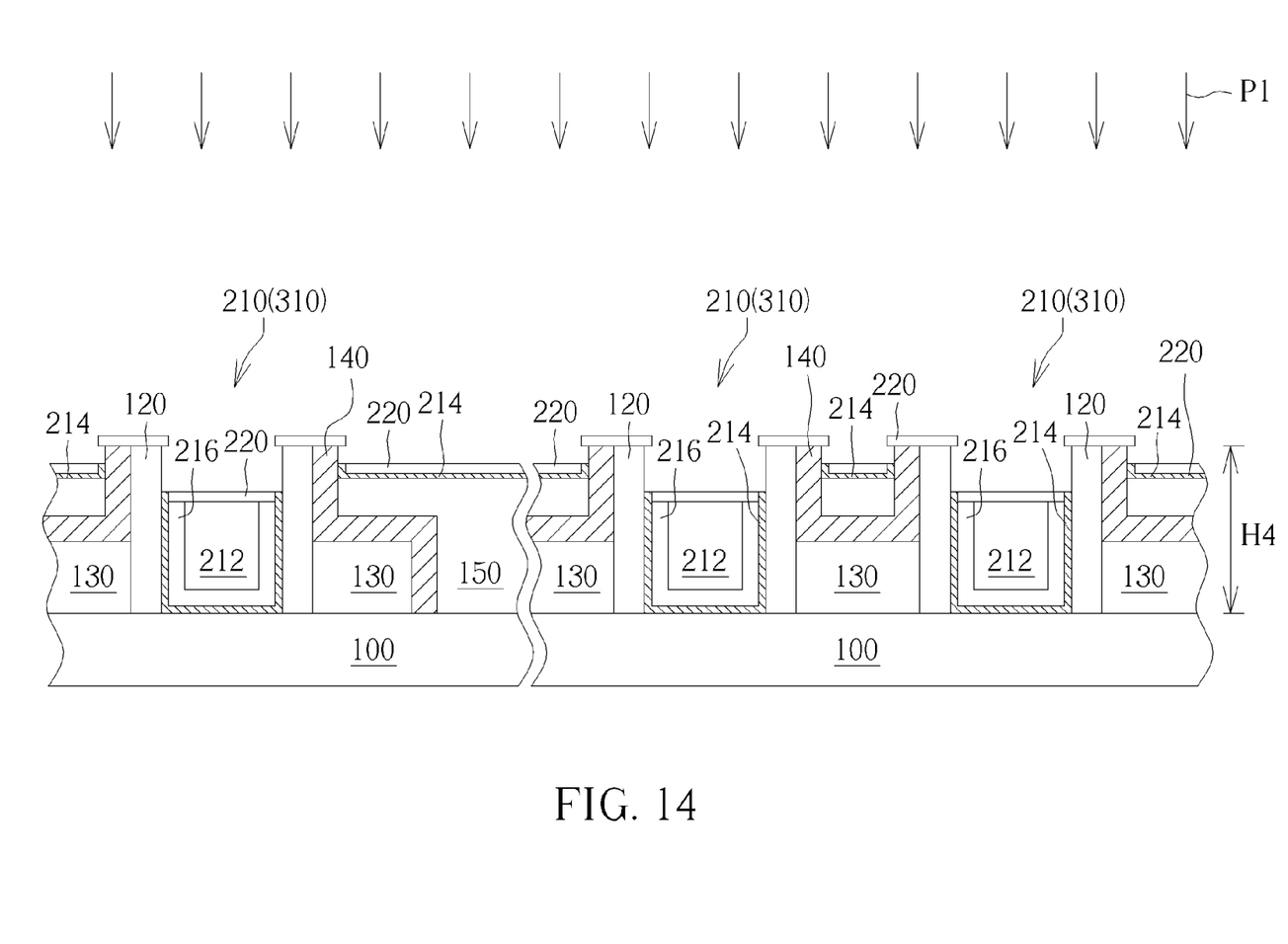

Please refer to FIG. 14, similar to the process performed in FIG. 5, the etching process, such as an isotropic etching process P1 is carried out to remove the exposed dielectric layers 214 in the trench 210 until the corresponding spacers 120 are exposed. At this time, because the bottoms of the recesses 320 are covered by the protection film 220, the height of the first interlayer dielectric 150 is not further reduced during the etching process. As a result, space formed above the conductive layer 212 may be high enough to accommodate the subsequently formed hard mask (not shown) and the heights of the initial dummy gates can be therefore reduced. Specifically, in a case where the composition of the dielectric layers 214 is oxide, the formula of the isotropic etching process P1 may be dilute hydrofluoric acid (DHF), but not limited thereto. Alternatively, the protection film 220 is not limited to be formed after the removal of the work function layers 216, and it may also be deposited before the removal of the work function layers 216. In this way, the work function layers 216 may remain uncovered after the formation of the protection film 220. In the following processes, the layer of hard mask and the self-aligned contact may be formed. Since these processes are similar to those shown in FIG. 7 to FIG. 10, the detailed description of those is therefore omitted.

To summarize, the present invention provides a method for fabricating a semiconductor device having a metal electrode and a self-aligned contact structure. According to embodiments of the present invention, a protection layer is at least formed on the top surface of an interlayer dielectric before the removal of a high-k dielectric layer. In this way, the height of the interlayer dielectric is not reduced during a process for removing the high-k dielectric layer. As a result, the height of an initial dummy gate can be correspondingly reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
    forming an interlayer dielectric on a substrate;
    forming a trench surrounded by the interlayer dielectric;
    sequentially and conformally depositing a dielectric layer and a work function layer on a surface of the trench;
    filling up the trench with a conductive layer;
    removing an upper portion of the conductive layer inside the trench;
    forming a protection film on a top surface of the interlayer dielectric and a top surface of the conductive layer after the step of removing the upper portion of the conductive layer inside the trench;
    removing the dielectric layer exposed from the protection film; and
    forming a hard mask in the trench to cover the protection film.

2. The method according to claim 1, wherein the interlayer dielectric and the dielectric layer are made of oxides.

3. The method according to claim 1, wherein both the work function layer and the conductive layer are covered by the protection film.

4. The method according to claim 1, wherein an etching rate of the dielectric layer is 5 times greater than an etching rate of the protection film during the step of removing the dielectric layer exposed from the protection film.

5. The method according to claim 1, further comprising removing portions of the work function layer in the trench before removing the dielectric layer.

6. The method according to claim 1, wherein a process for removing the dielectric layer exposed from the protection film is an isotropic etch process.

7. The method according to claim 6, further comprising removing the protection layer before a step for forming the hard mask.

8. The method according to claim 1, wherein the protection film and the hard mask are made of nitrides.

9. The method according to claim 1, wherein the hard mask comprises a rugged surface, the method further comprising:
    depositing a cover layer on the hard mask;
    etching portions of the cover layer and portions of the hard mask concurrently so as to obtain an etched hard mask;
    removing the cover layer; and
    planarizing the etched hard mask.

10. The method according to claim 1, further comprising planarizing the hard mask until a top surface of the hard mask is level with a top surface of the interlayer dielectric.

11. The method according to claim 10, further comprising blank etching upper portions of the hard mask before planarizing the hard mask.

12. The method according to claim 10, before planarizing the hard mask, further comprising:
    depositing a patterned cover layer to expose portions of the hard mask; and
    etching the hard mask exposed from the cover layer.

13. The method according to claim 1, before forming the trench, further comprising:
    forming a dummy gate structure on the substrate;
    forming spacers on sidewalls of the dummy gate respectively;
    forming the interlayer dielectric to cover the gate structure and the substrate; and
    removing upper portions of the interlayer dielectric until the dummy gate structure is exposed; and
    removing the dummy gate structure.

14. The method according to claim 13, wherein each of the spacers has a multi-layered structure.

15. The method according to claim 14, wherein the spacers protrude from the ILD after removing the dummy gate structure.

16. The method according to claim 13, wherein the spacers are in direct contact with the hard mask.

17. The method according to claim 13, wherein upper portions of the spacers are surrounded by the hard mask.

18. The method according to claim 1, further comprising forming a recess at a top surface of the interlayer dielectric before the step of depositing the dielectric layer and the work function layer.

19. The method according to claim 18, wherein the protection film covers the dielectric layer in the recess.

* * * * *